United States Patent [19]

Furukawa et al.

[11] Patent Number: 4,885,614

[45] Date of Patent: Dec. 5, 1989

[54] SEMICONDUCTOR DEVICE WITH CRYSTALLINE SILICON-GERMANIUM-CARBON ALLOY

[75] Inventors: Seijiro Furukawa, Kawasaki; Hiroyuki Etoh, Kokubunji; Akitoshi Ishizaka, Kokubunji; Toshikazu Shimada, Kokubunji, all of Japan

[73] Assignee: Hitachi, Ltd., Tokyo, Japan

[21] Appl. No.: 216,522

[22] Filed: Jul. 8, 1988

[30] Foreign Application Priority Data

Jul. 10, 1987 [JP] Japan .................................. 62-170947

[51] Int. Cl.⁴ ............................................ H01L 29/161
[52] U.S. Cl. ........................................... 357/16; 357/4; 357/30; 357/61; 420/556
[58] Field of Search .................... 357/4, 16, 30, 61; 148/DIG. 72; 420/556

[56] References Cited

U.S. PATENT DOCUMENTS

| | | | |
|---|---|---|---|
| 3,721,583 | 3/1973 | Blakeslee | 148/DIG. 72 |
| 4,213,781 | 7/1980 | Norieka et al. | 420/556 |
| 4,492,810 | 1/1985 | Ovshinsky et al. | 357/30 |
| 4,495,262 | 1/1985 | Matsuzaki et al. | 357/2 |
| 4,766,092 | 8/1988 | Kuroda et al. | 357/16 |
| 4,769,341 | 9/1988 | Luryi | 357/16 |

OTHER PUBLICATIONS

Milnes, A. G., *Solid State Elec.*, vol. 29, No. 2, pp. 99–121, 1986, "Semiconductor on Overview".

*Primary Examiner*—Andrew J. James
*Assistant Examiner*—Jerome Jackson
*Attorney, Agent, or Firm*—Antonelli, Terry & Wands

[57] ABSTRACT

The present invention discloses a semiconductor device comprising a semiconductor layer being made of monocrystalline silicon or silicon-germanium alloy and a semiconductor layer being made of silicon-germanium-carbon alloy formed thereon, wherein the two layers form a heterojunction therebetween. In such a device, no lattice mismatch occurs between the layers or even if lattice mismatch occurs, it is only slight, so that the silicon-germanium-carbon alloy layer is in no danger of causing misfit dislocation therein.

28 Claims, 3 Drawing Sheets

SEMICONDUCTOR DEVICE WITH CRYSTALLINE SILICON-GERMANIUM-CARBON ALLOY

BACKGROUND OF THE PRESENT INVENTION

1. Field of the Invention

The present invention relates to a semiconductor device having a semiconductor layer being made mainly of silicon. The semiconductor device includes electronic elements such as a bipolar transistor and a field effect transistor and optical elements such as a photodiode.

2. Description of the Related Arts

In the field of semicondutor devices using silicon, silicon-germanium alloys comprising group IV elements have been studied as a semiconductor material, the monocrystal of which can be grown on monocrystalline silicon. A silicon-germanium alloy has an advantage in that the energy bandgap of the alloy can be monotonously varied by varying the germanium content thereof (see D.V. Lang et al., Applied Physics Letters, vol. 47, page 1333 (1986)). Further, the energy bandgap of a silicon-germanium alloy is smaller than that of monocrystalline silicon, so that various devices utilizing the difference between these energy bandgaps have been studied. For example, photodiodes using a multi-layer film comprising a monocrystalline silicon layer and a silicon-germanium layer and modified field effect transistors have been made on an experimental basis.

However, the monocrystal of a silicon-germanium alloy exhibits enhanced lattice mismatch against monocrystalline silicon as the germanium content thereof increases, thus causing distortion therein. Therefore, when monocrystalline silicon-germanium alloy having a high germanium content is grown on monocrystalline silicon, misfit dislocation due to this distortion occurs therein, which is a fatal defect for the application of the alloy to semiconductor devices. Particularly, when a thin monocrystalline silicon-germanium alloy layer is grown on monocrystalline silicon, a critical thickness for growing the monocrystal of the alloy without causing misfit dislocation comes into existence in relation to the germanium content of the silicon-germanium alloy layer.

This critical layer thickness decreases as the germanium content increases. For example, when the germanium content is 40%, which means that the difference in energy bandgap between monocrystalline silicon and silicon-germanium alloy is about 0.3 eV, the critical layer thickness of the thin alloy film has been reported to be 200 to 300 Å (see R. People et al., Applied Physics Letters, vol. 47, page 322, (1985)).

Owing to the disadvantage as described above, there arises a technical problem that when silicon-germanium alloy monocrystal is grown on monocrystalline silicon in a thickness exceeding its critical value, too many misfit dislocations are generated in the alloy to obtain a thick film excellent in crystallinity. Meanwhile, in order to increase the critical layer thickness of a silicon-germanium alloy layer, the germanium content of the layer must be reduced, which brings about another technical problem that the use of silicon-germanium alloy having a desired energy bandgap becomes impossible.

SUMMARY OF THE INVENTION

In accordance with one aspect of the present invention, a semiconductor device comprising a first semiconductor layer being made of a monocrystalline semiconductor material comprising silicon as a main component and a second semiconductor layer made of a monocrystalline semiconductor material which is obtained by incorporating carbon into a silicon-germanium alloy is provided. This semiconductor device includes ones having such a structure that the first and the second semiconductor layers form a heterojunction therebetween.

In accordance with a more limited aspect of the present invention, a semiconductor device as described above wherein the first semiconductor layer is made of monocrystalline silicon or silicon-germanium alloy is provided.

In accordance with another aspect of the present invention, a semiconductor device comprising a first semiconductor layer which is made of a semiconductor material comprising silicon as a main component and has a first lattice constant and a second semiconductor layer which is made of a semiconductor material obtained by incorporating carbon into silicon-germanium alloy and has a second lattice constant, wherein the first and the second semiconductor layers form a junction therebetween and the second lattice constant is made substantially coincidental with the first lattice constant by setting a desired carbon content in the second layer, is provided.

One advantage of the present invention is that a semiconductor device comprising a first semiconductor layer made of a semiconductor material comprising silicon as a main component and a second semiconductor layer formed thereon having reduced lattice mismatch so as not to cause misfit dislocation can be produced.

Another advantage of the present invention is that a semiconductor device comprising a semiconductor layer made of a semiconductor material comprising silicon as a main component and a second semiconductor layer formed thereon having a desired energy bandgap in relation to that of the first layer can be produced.

Another advantage of the present invention is that a semiconductor device comprising a first semiconductor layer made of a semiconductor material comprising silicon as a main component and a second semiconductor layer formed thereon wherein the energy bandgap of the second layer can be continuously or intermittently varied can be produced.

Still further advantage of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts or in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
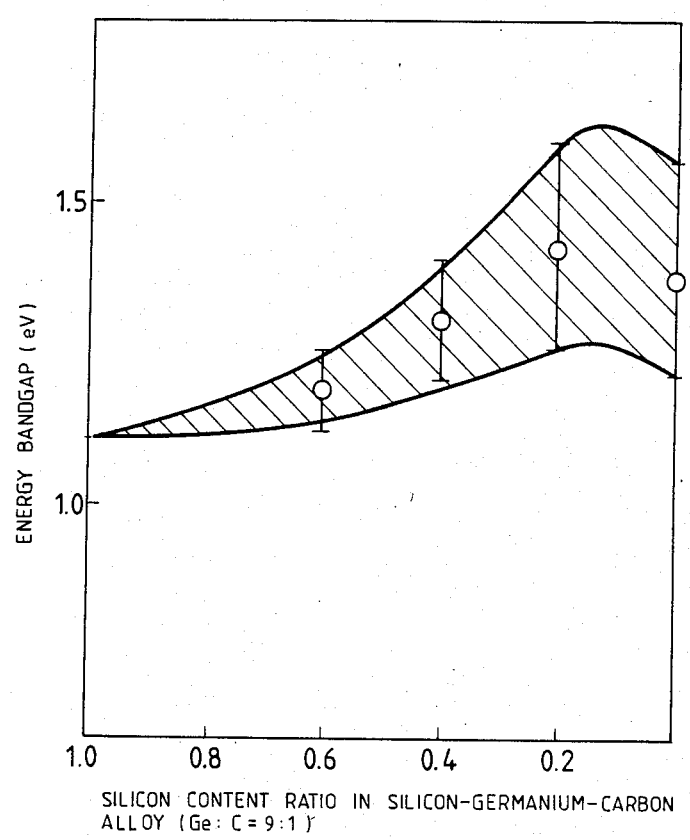
FIG. 1 is a graph which shows the relationship between energy bandgap and silicon content in the silicon-germanium-carbon material.

With reference to FIG. 1, carbon-containing silicon-germanium alloy which is a feature of the present invention will now be described. The lattice constant of a crystal (with a diamond structure) of carbon which is a group IV element like silicon and germanium is smaller than that of silicon crystal. Accordingly, a silicon-germanium-carbon alloy obtained by incorporating carbon into silicon-germanium alloy exhibits a smaller lattice constant than that of the silicon-germanium alloy which is larger than that of silicon monocrystal. Further, it is possible to obtain silicon-germanium-carbon alloy having a lattice constant coincidental with that of monocrystalline silicon. Furthermore, the energy bandgap of silicon-germanium-carbon alloy can be varied by changing the content ratios of the elements, while keeping the lattice constant thereof constant. More precisely, the energy bandgap of silicon-germanium-carbon alloy can be adjusted to a desired one by changing the ratios of germanium and carbon to silicon at a constant ratio of germanium to carbon, while keeping the lattice constant of the alloy at a desired one. For example, energy bandgap of a silicon-germanium-carbon semiconductor material having a germanium/carbon ratio of 9 : 1 is plotted against the silicon content of the material in FIG. 1. It can be understood from the results shown in FIG. 1 that the energy bandgap increases as the silicon content decreases.

Figure 2:
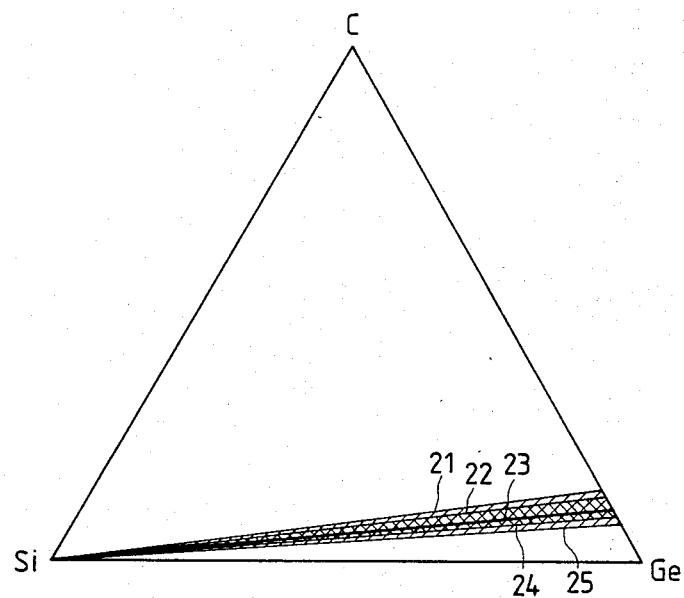
FIG. 2 is a graph in which favorable content ratios of silicon, germanium and carbon in silicon-germanium-carbon material are indicated.

With reference to FIG. 2, the contents of carbon and germanium in the silicon-germanium-carbon semiconductor layer will be described. It is preferred that the lattice constant of the silicon-germanium-carbon semiconductor layer be made substantially coincidental with that of the semiconductor layer made mainly of silicon to be junctioned therewith, in order to control factors which adversely affect the characteristics, for example, misfit dislocation generated in the former layer. It is still preferred that the lattice constant mismatch between the monocrystalline silicon semiconductor layer and the silicon-germanium-carbon semiconductor layer to be junctioned therewith be 1% or below. In a case satisfying this requirement, a relatively thin silicon-germanium-carbon semiconductor layer excellent in crystallinity can be obtained. The range wherein such a preferable layer can be obtained is illustrated in FIG. 2 as an area sandwiched between straight lines 21 and 25. FIG. 2 is a graph indicating the preferable range of content ratios of elements constituting the silicon-germanium-carbon semiconductor material wherein a full line 23 indicates the content ratios thereof at which the lattice constant of the material is substantially coincidental with that of monocrystalline silicon. In the silicon-germanium-carbon semiconductor materials indicated by the solid line 23, the atomic number ratio of germanium/carbon is 9/1. Particularly, when the lattice mismatch is 0.5% or below, a relatively thick silicon-germanium-carbon semiconductor layer excellent in crystallinity can be grown on a monocrystalline silicon layer. In FIG. 2, the area sandwiched between straight lines 22 and 24 corresponds to a range wherein the lattice mismatch is 0.5% or below and solid lines 21, 22, 23, 24 and 25 each correspond to the materials having an atomic number ratio of germanium/carbon of 6.7/1, 7.6/1, 9/1, 10/1 and 12/1, respectively.

The present invention has a characteristic in that a silicon-germanium-carbon semiconductor layer is used as a semiconductor layer to form a heterojunction with a semiconductor layer made mainly of silicon. Accordingly, the present invention admits of application to any semiconductor device having a heterojunction. The present invention will now be illustrated in more detail by the preferred embodiments which will be described.

Figure 3:
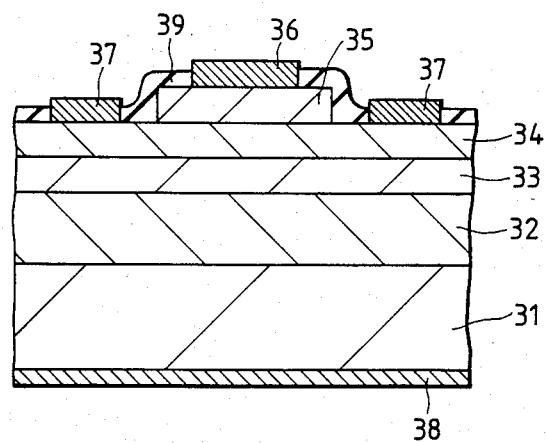
FIG. 3 illustrates an example wherein the present invention is applied to a heterojunction bipolar transistor.

With reference to FIG. 3, an example of producing a heterojunction bipolar transistor (hereinafter abbreviated to "HBT") wherein silicon-germanium-carbon alloy is used as its emitter will be described. An $n^--Si$ collector layer 32 having a thickness of 2 $\mu$m and an impurity concentration of $10^{16}$ cm$^{-3}$ is formed on an $n^+-Si(100)$ substrate 31 having an impurity concentration of $10^{18}$ cm$^{-3}$ by a conventional method such as CVD method. The surface of the obtained composite is subjected to chemical cleaning and the resulting composite is introduced into a molecular beam epitaxy system (hereinafter referred to as the "MBE system"). The surface of the composite is further cleaned and the temperature of the substrate is adjusted to 550° C. An $n^--Si$ layer 33 having an impurity concentration of $10^{16}$ cm$^{-3}$ and a thickness of 0.1 $\mu$m is grown on the layer 32 by irradiation with molecular beams of Si and Sb (though the formation of the layer 33 is not always necessary for the production of HBT). Further, a p-Si base layer 34 having an impurity concentration of $10^{16}$ cm$^{-3}$ and a thickness of 0.1 $\mu$m is grown by irradiation with molecular beams of Si and Ga. Furthermore, an $n^+$-silicon-germanium-carbon emitter layer 35 having an impurity concentration of $10^{19}$ cm$^{-3}$ and a thickness of 0.3 $\mu$m is grown on the layer 34 by irradiating the layer 34 with molecular beams of Si, Ge, C and Sb at a beam intensity ratio of Si to Ge to C of 40 : 54 : 6. The silicon-germanium-carbon alloy thus obtained has an energy bandgap of about 1.3 eV which is larger than that of silicon. The obtained composite was taken out of the MBE system and subjected to dry etching. An isolation film 39 is formed by a conventional method, and then, an emitter electrode 36, a base electrode 37 and a collector electrode 38 are formed to obtain HBT.

In this example, the heterojunction present in the interface between the base layer 34 and the emitter layer 35 is formed by junction of monocrystalline silicon with monocrystalline silicon-germanium-carbon alloy. No lattice mismatch occurs in the emitter layer 35, so that a bipolar transistor having excellent characteristics can be obtained. The current flow between the emitter electrode 36 and the collector electrode 38 is controlled by the base electrode 37.

The transistor produced in this example exhibits a high current gain of 1000. Although the production of an n-p-n transistor has been described in this example, a p-n-p transistor comprising an emitter made of silicon-germanium-carbon alloy can also be produced in a similar manner to the one described above.

It can be understood from the results of this example that a transistor having excellent characteristics can be produced by using an emitter region made of silicon-germanium-carbon alloy.

Figure 4:
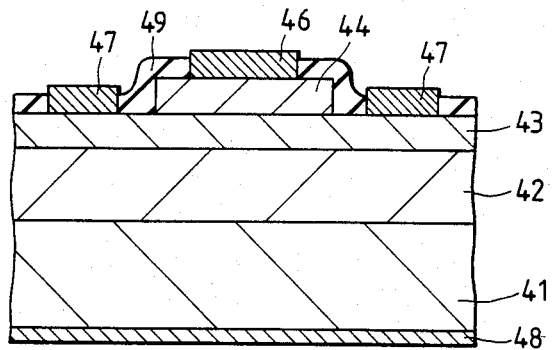
FIG. 4 illustrates another example wherein the present invention is applied to another heterojunction bipolar transistor.

With reference to FIG. 4, an example of producing an HBT comprising a base layer made of silicon-germanium-carbon alloy will be described. In a similar manner to the one described in the above example, an $n^- -Si$ collector layer 42 is formed on an $n^{30} -Si$ substrate 41. The obtained composite is subjected to chemical cleaning and introduced into the MBE system to clean the surface of the composite. The temperature of the substrate is adjusted to 600° C. A p-silicon-germanium-carbon alloy having a Ga concentration of $10^{18}$ cm$^{-3}$ is grown to a thickness of 0.1 $\mu$m on the collector layer 42 by irradiating the layer 42 with molecular beams of Si, Ge, C and Ga at a beam intensity ratio of Si to Ge to C of 70 : 29 : 1 to form a base layer 43. This silicon-germanium-carbon alloy film 43 exhibits an energy bandgap which is smaller than that of silicon by 0.1 to 0.2 eV. Further, an $n^+ -Si$ film 44 having an Sb concentration of $10^{19}$ cm$^{-3}$ is grown on the film 43 to a thickness of 0.3 $\mu$m by the MBE method. Then, similarly to the example described above, the obtained composite is subjected to dry etching. An isolation film 49 is formed, and then, an emitter electrode 46, a base electrode 47 and collector electrode 48 are formed according to a conventional method such as vaporization to obtain transistor.

In this example, the heterojunction between the base layer 43 and the collector layer 42 is formed by junction of silicon-germanium-carbon alloy with monocrystalline silicon. This example is different from the first example in that the energy bandgap of the silicon-germanium-carbon layer 43 is set at a value smaller than that of monocrystalline silicon. This transistor exhibits a high current gain of 500. Further, a transistor comprising an n-type base made of silicon-germanium-carbon alloy can also be produced in a similar manner to the one described above.

It can be understood from the results of this example that an excellent transistor can be obtained by using silicon-germanium-carbon alloy as a base.

Figure 5:
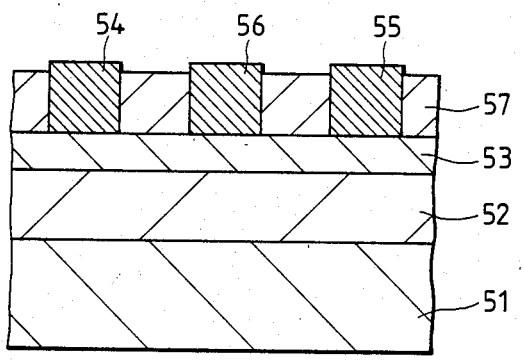
FIG. 5 illustrates an example wherein the present invention is applied to a field effect transistor.

With reference to FIG. 5, an example of a modulation doped field effect transistor (hereinafter abbreviated to "MODFET") comprising a semiconductor layer made of silicon-germanium-carbon alloy will be described. An $n^- -$monocrystalline silicon plate 50 of $10^4$ $\Omega$·cm is subjected to chemical cleaning and introduced into the MBE system to clean the surface thereof. The resulting plate is irradiated with molecular beams of silicon at a temperature of the plate of 650° C. to thereby grow an undoped silicon layer 51 to a thickness of 0.8 $\mu$m. Thus, a Si layer 51 is formed. This substrate is irradiated with molecular beams of Si, Ge and C at a beam intensity ratio of Si to Ge to C of 40 : 54 : 6 to grow monocrystalline silicon-germanium-carbon alloy. After an undoped silicon-germanium-carbon film 52 thus formed has been grown to a thickness of 50 Å, the irradiation using Ga molecular beam in addition to the above beams is carried out to form a p-silicon-germanium-carbon alloy layer 53 having a Ga concentration of $10^{17}$ cm$^{-3}$ and a thickness of 0.1 $\mu$m.

The resulting substrate is taken out of the MBE system and subjected to photoetching, followed by the formation of source and drain electrodes 54 and 55 and a gate electrode 56 according to a conventional method. Thus, a MODFET of p-channel is produced. The gate electrode 56 and the layer 53 forms a Schottky junction and the current flow between the source electrode and the drain electrode is controlled by the field applied to the gate electrode 56. The obtained element exhibits an excellent mutual conductance of 80 mS/mm, when its gate length is 1.6 $\mu$m. Further, a MODFET of n-channel can also be produced in a similar manner to the one described above.

It can be understood from the results of this example that a MODFET excellent in characteristics can be produced by using a silicon-germanium-carbon alloy film.

Figure 6:
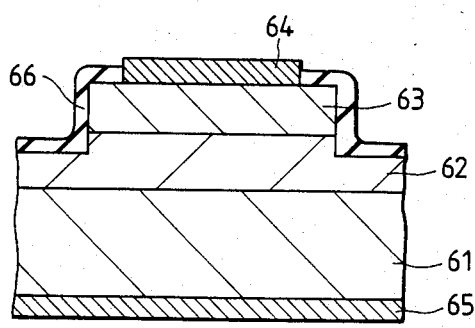
FIG. 6 is illustrates an example wherein the present invention is applied to a photodiode.

With reference to FIG. 6, a pin photodiode using a silicon-germanium-carbon layer as the i-layer will be described. An $n^+ -Si(100)$ substrate 61 having an impurity concentration of $10^{19}$ cm$^{-3}$ is subjected to chemical cleaning and introduced into the MBE system to clean the surface thereof. The temperature of the substrate is adjusted to 600° C. The resulting substrate is irradiated with molecular beams of Si, Ge and C to form an undoped film 62 having a thickness of 1 $\mu$m and an atomic number ratio of Si to Ge to C of 60 : 36 : 4. Further, the irradiation with molecular beams of Si and Ga is continued to form a $p^+ -Si$ layer 63 having a Ga concentration of $10^{19}$ cm$^{-3}$ and a thickness of 0.2 $\mu$m, followed by photoetching. Electrodes 64 and 65 were formed to obtain a pin photodiode. The energy bandgap of a photodiode such as the one described above can be varied in the range of 0.9 to 1.6 eV by changing the composition of the silicon-germanium-carbon to be used as the i-layer, so that the photo-receiving range of the photodiode can be varied in the range of 780 to 1400 nm.

It can be understood from the result of this example that the photo-receiving range of a pin photodiode wherein a silicon-germanium-carbon alloy film is used as the i-layer can be arbitrarily controlled in the range of 780 to 1400 nm by changing the composition of the alloy.

Although the foregoing description has been given to the bipolar transistor, FET and photodiode, the present invention can, of course, be applied to other electronic and optical elements. The essential requirement for the device according to the present invention is that the device has a structure comprising a semiconductor layer (irrespective of its conductivity type) being made of a semiconductor material comprising silicon as a main component and a silicon-germanium-carbon semiconductor layer (also irrespective of its conductivity type) formed directly thereon. These two layers may either contain other elements such as gallium or antimony as conductive impurities (donor or acceptor) or not contain them. Namely, the conductivity type of each layer may be selected depending upon the function of the element to which the present invention is applied. The semiconductor layer being made mainly of silicon and the silicon-germanium-carbon layer to be formed directly thereon will be described in more detail in the following EXAMPLES. These EXAMPLES can be each applied to the elements as described above.

EXAMPLE 1

A silicon (100) substrate which had been subjected to chemical cleaning was introduced into a molecular beam epitaxy (MBE) system to clean the surface thereof by thermal treatment in an ultra-high vacuum. The term "MBE system" generally refers to a vaporization system having an ultimate degree of vacuum of $10^9$ Torr or below and provided with a plurality of independent evaporators for generating molecular or atomic beams. The MBE system used in this EXAMPLE had an ultimate degree of vacuum of $5 \times 10^{-11}$ Torr and was provided with electron guns for silicon and carbon and a Knudsen cell for germanium as evaporators.

The temperature of the cleaned substrate was adjusted to 600° C. From the point of time at which the temperature became constant, the growth of silicon-germanium-carbon alloy was initiated at a molecular beam intensity ratio of Si to Ge to C of 80 : 18 : 2. When the thickness of the silicon-germanium-carbon film reached about 1 μm, the growth thereof was discontinued.

The lattice constant of the silicon-germanium-carbon alloy thus prepared was nearly equal to that of the silicon substrate, so that the obtained film had a low dislocation density and excellent crystallinity.

Although the above description has been given to a case using a silicon (100) substrate, similar results were obtained, when silicon substrates having other crystal orientation such as (111), (511) or (110) were used. Further, in other cases, similar results were obtained irrespective of the kind of the crystal orientation of the substrate used.

EXAMPLE 2

This EXAMPLE illustrates the variation of the energy bandgap (hereinafter abbreviated to "Eg") of a silicon-germanium-carbon film with the composition thereof with the proviso that the lattice constant of the film is kept coincidental with that of silicon.

In a similar manner to the one described in EXAMPLE 1, a silicon substrate was irradiated with molecular beams of Si, Ge and C to grow a silicon-germanium-carbon alloy film thereon. In this irradiation, the beam intensities were so controlled as to give an atomic number ratio of Si to Ge to C of 60 : 36 : 4 (film 1), 40 : 54 : 6 (film 2), 20 : 72 : 8 (film 3) or 0 : 90 : 10 (film 4). In all of the films, the atomic number ratio of Ge to C was 9 : 1. When the thickness of the alloy film reached about 1 μm, the growth of the film was discontinued.

The films 1, 2, 3 and 4 thus formed each exhibited a lattice constant coincidental with that of the silicon substrate. It can be understood from these results that the lattice constant of a silicon-germanium-carbon alloy film can be made to coincide with that of silicon by adjusting the atomic number ratio of Ge to C to 9 : 1. Further, the Eg of the films 1, 2, 3 and 4 were about 1.2 eV, 1.3 eV, 1.4 eV and 1.35 eV, respectively, which are all larger than that of silicon, i.e., 1.12 eV (see FIG. 1). Furthermore, it can be understood from the results shown in FIG. 1 that a silicon-germanium-carbon alloy film which is free from lattice mismatch against silicon and has an Eg different from that of silicon can be prepared at a silicon content of up to 90 atomic percent, i.e., at a carbon content of at least 1 atomic percent.

It can be understood from the results of this EXAMPLE that the Eg of a silicon-germanium-carbon alloy film having the same lattice constant as that of silicon can be varied in the range of 1.1 to 1.6 eV.

EXAMPLE 3

In a similar manner to that described in EXAMPLE 1, a silicon-germanium-carbon alloy layer having an atomic number ratio of Si to Ge to C of 80 : 18 : 2 and a thickness of 1 μm was grown on a silicon substrate. Further, the alloy layer was irradiated with silicon molecular beams to form a silicon film having a thickness of 1 μm thereon.

This silicon film exhibited a remarkably low dislocation density and excellent crystallinity.

It can be understood from the result of this EXAMPLE that a silicon-germanium-carbon alloy film having a lattice constant coincidental with that of silicon permits the epitaxial growth of a silicon film thereon.

EXAMPLE 4

This EXAMPLE discloses a case wherein a doped silicon-germanium-carbon alloy film is used.

In a similar manner to the one described in EXAMPLE 1, a silicon-germanium-carbon alloy was grown on a silicon substrate at a molecular beam intensity ratio of Si to Ge to C of 80 : 18 : 2, while simultaneously irradiating the substrate with antimony molecular beams. Thus, an n-type silicon-germanium-carbon alloy film was formed. The concentration of the n-type impurities was about $10^{18}$ cm$^{-3}$. When the thickness of the alloy film reached about 1 μm, the growth of the film was discontinued.

The silicon-germanium-carbon alloy film thus prepared exhibited excellent crystallinity, which means that the crystallinity of the film is not affected by doping with impurities.

In the multi-layer film obtained by growing silicon-germanium-carbon films free from lattice mismatch against silicon and silicon films alternately on a silicon substrate, super doping, i.e., doping of the silicon films only was effective in enhancing the activity coefficient of dopant.

Although the above EXAMPLES all pertain to the cases wherein the lattice constant of a silicon-germanium-carbon alloy layer is coincidental with that of silicon, a silicon-germanium-carbon film can be grown on a silicon substrate without causing misfit dislocation, even when there is small lattice constant mismatch between silicon and silicon-germanium-carbon alloy. Such cases will be described in the following EXAMPLES.

EXAMPLE 5

In a similar manner to the one described in EXAMPLE 1, the growth of silicon-germanium-carbon alloy on a silicon substrate was carried out to form a film 5 having an atomic number ratio of Si to Ge to C of 70 : 29 : 1 and a thickness of 1 μm, a film 6 having the same composition as that of the film 5 and a thickness of 0.1 μm and a film 7 having an atomic number ratio of Si to Ge to C of 70 : 28 : 2 and a thickness of 1 μm.

Among these films, the film 5 has a lattice mismatch of about 0.8% against silicon, so that many misfit dislocations due to distortion occurred between the film and the substrate, while the film 6 having the same composition as the one of the film 5 exhibited commensurate growth wherein its lattice constant in the direction parallel to the substrate was coincidental with that of the substrate, due to its thinness. Further, although the film 7 caused distortion of about 0.4% therein owing to the difference in lattice constant between the film and the silicon substrate, the film 7 exhibited commensurate growth to be excellent in crystallinity, because its distortion was slight.

The energy bandgaps of the films 6 and 7 were all lower than that of silicon by 0.1 to 0.2 eV.

It can be understood from the results of this EXAMPLE that the germanium/carbon atomic number ratio of the silicon-germanium-carbon alloy which is epitaxially growable on silicon is in the range of 6.7 to 12, preferably 7.6 to 10.

Although the foregoing EXAMPLES 1 to 5 all pertain to the production of silicon-germanium-carbon alloy films by molecular beam epitaxy (MBE), similar silicon-geranium-carbon alloy films can be produced by other film forming methods such as thermal CVD, photo-CVD, plasma-enhanced CVD, microwave-excited plasma CVD or MOCVD. In the thermal CVD, photo-CVD and plasma-enhanced CVD methods, silane gas, germane gas and methane are generally used as silicon, germanium and carbon sources, respectively, though other gases such as halide, organosilane and germane may be used. In the MOCVD method, for example, organosilicon, organogermanium and methane are used to form a silicon-germanium-carbon alloy film on a silicon substrate. The silicon-germanium-carbon alloy films formed by these methods exhibited characteristics similar to those of the film formed by the MBE method.

The silicon-germanium-carbon alloy film formed on a silicon substrate by the above method is useful as a base of a bipolar transistor, a channel of a modified FET or the like. Further, the use of the film as the i-layer of a photodetector is very effective.

The production of a silicon-germanium-carbon alloy film by the methods described above will now be described in the following EXAMPLES.

EXAMPLE 6

This EXAMPLE discloses a process of producing a silicon-germanium-carbon alloy by the plasma-enhanced CVD method. A silicon substrate was subjected to chemical cleaning and introduced into a reactor of a plasma-enhanced CVD system, followed by the cleaning of the surface thereof. The temperature of the substrate was adjusted to 550° C. Gaseous $SiH_4$, $GeH_4$ and $CH_4$ were introduced into the reactor as Si, Ge and C sources, respectively. Alternatively, $Si_2H_6$ (silicon source), $GeF_4$ (germanium source) and $C_2H_4$, $C_2H_2$ or $SiH_2(CH_3)_2$ (carbon source) may be used in this step. Further, a carrier gas such as $H_2$ or He may be used additionally. These gases were introduced into the reactor and a high-frequency power of 13.56 MHz was applied to react the gases under a pressure of 0.5 Torr. Thus, a silicon-germanium-carbon alloy having the same composition as that of the alloy formed in EXAMPLE 1 or 2 was formed on the substrate. The control of the composition was carried out by controlling the flow rates of reactive gases. Further, $PH_3$ or $B_2H_6$ may be simultaneously introduced in a state diluted with $H_2$ or He to form a doped silicon-germanium-carbon layer of n or p type, respectively.

The silicon-germanium-carbon alloy thus produced exhibited characteristics similar to those of the alloy film produced by the MBE method. More precisely, the lattice constant of the alloy was nearly coincidental with that of the silicon substrate, while the variation of the Eg of the alloy with the composition thereof is similar to the one shown in FIG. 1. It can be understood that a silicon-germanium-carbon layer having a lattice constant nearly equal to that of silicon and an energy bandgap different from that of silicon can be produced by the plasma-enhanced CVD method.

EXAMPLE 7

This EXAMPLE discloses a process of producing a silicon-germanium-carbon alloy by the photo-CVD method. The surface of a silicon substrate was cleaned and the temperature thereof was adjusted to 400° C. $Si_2H_6$, $GeH_4$ and $C_2H_4$ were introduced into a reactor and irradiated with ultraviolet light of 185 nm under a pressure of 5 Torr to thereby carry out the reaction. The flow rates of these sources were controlled to form a silicon-germanium-carbon alloy film having the same composition as that of the alloy produced in EXAMPLE 6 and a thickness of 1 μm on the silicon substrate. This alloy film exhibited characteristics similar to those of the film formed in EXAMPLE 6.

It can be understood from the results of this EXAMPLE that a silicon-germanium-carbon alloy having a lattice constant nearly equal to that of silicon and an Eg different from that of silicon can be produced by the photo-CVD method.

EXAMPLE 8

This EXAMPLE discloses a process of producing a silicon-germanium-carbon alloy by the microwave-excited plasma CVD method. A silicon substrate was introduced into a reactor to clean the surface thereof. The temperature of the substrate was adjusted to 500° C. Gaseous $SiH_4$, $GeH_4$ and $CH_4$ were introduced into the reactor. Microwave of 2.45 GHz was applied under a pressure of $10^{-3}$ Torr to carry out the reaction. The flow rates of the sources were controlled to form a silicon-germanium-carbon alloy film having the same composition as that of the alloy produced in EXAMPLE 6 and a thickness of 1 μm on the substrate. This alloy film exhibited characteristics similar to those of the alloy produced in EXAMPLE 6.

It can be understood from the result of this EXAMPLE that a silicon-germanium-carbon alloy film having a lattice constant nearly equal to that of silicon and an Eg different from that of silicon can be produced by the microwave-excited plasma CVD method.

EXAMPLE 9

This EXAMPLE discloses a process of producing a silicon-germanium-carbon alloy film by the thermal CVD or MOCVD method. The surface of a silicon substrate was cleaned and the temperature thereof was adjusted to 650° C. Gaseous $SiH_4$, $GeH_4$ and $CH_4$ were introduced into a reactor so as to give a total pressure of 100 Torr. Thus, a silicon-germanium-carbon alloy film was formed on the substrate by the thermal CVD method. Further, a similar film was also produced on another substrate by the MOCVD method by using $Si(CH_3)_4$, $Si(C_2H_5)_4$, $Si(n-C_3H_7)4$ or $Si(C_4H_9)_4$ as a silicon source and $Ge(CH_3)_4$ or $Ge(C_2H_5)_4$ as a germanium source. The silicon-germanium-carbon alloy films thus formed exhibited characteristics similar to those of the film formed by the MBE method in

EXAMPLE 1 or 2.

It can be understood that a silicon-germanium-carbon alloy having a lattice constant nearly equal to that of silicon and an Eg different from that of silicon can be formed by the thermal CVD or MOCVD method.

EXAMPLE 10

This EXAMPLE discloses a process of growing a silicon-germanium-carbon alloy film on silicon-germanium alloy.

A silicon-germanium film was formed on the same silicon substrate as the one used in EXAMPLE 1 by using the same system as the one used in EXAMPLE 1. The molecular beam intensity ratio of Si to Ge was set at 90 : 10. When the thickness of the silicon-germanium alloy film reached 0.1 μm, the growth of the film was discontinued. Then, a silicon-germanium-carbon alloy film was grown on the silicon-germanium alloy film at a beam intensity ratio of Si to Ge to C of 90 : 9 : 1. When the thickness of the silicon-germanium-carbon film reached 1 μm, the growth of the film was discontinued.

Although the lattice constant of the silicon-germanium-carbon alloy film thus formed was coincidental with that of silicon, there was lattice constant mismatch of about 0.4% between the bulk of the silicon-germanium alloy and the silicon-germanium-carbon alloy. However, since the silicon-germanium alloy film was thinner than its critical thickness, its lattice constant in the direction parallel to the substrate was coincidental with that of silicon. Accordingly, no misfit dislocation occurred in the interface between the silicon-germanium-carbon alloy and the silicon-germanium alloy film.

It can be understood from the result of this EXAMPLE that the epitaxial growth of a silicon-germanium-carbon alloy film on a silicon-germanium alloy film is possible.

Although the invention has been described with reference to a bipolar transistor, a field effect transistor and a photodiode, it is to be appreciated that other semiconductor devices are applicable, including semiconductor devices having a heterojunction.

The invention has been described with reference to the preferred embodiments. Obviously, modifications and alterations will occur to those of ordinary skill in the art upon reading and understanding the present specification. It is intended that the invention be construed as including all such alterations and modifications insofar as they come with the scope of the appended claims or the equivalent thereof.

Having thus described the preferred embodiments, the invention is now claimed to be:

1. A semiconductor device comprising:
   a first crystalline semiconductor layer being made mainly of silicon; and
   a second single crystalline semiconductor layer made of silicon-germanium-carbon semiconductor material, wherein the first and the second semiconductor layers form a heterojunction therebetween, and wherein the atomic number ratio of germanium/carbon in the second semiconductor layer is in the range of 6.7/1 to 12/1.

2. The device as set forth in claim 1, wherein the first crystalline semiconductor layer is one selected from the group consisting of crystalline silicon and crystalline silicon-germanium.

3. The device as set forth in claim 1, wherein the first crystalline semiconductor layer has a first conductivity type and the second single crystalline semiconductor layer has a second conductivity type being different from the first conductivity type.

4. The device as set forth in claim 3, wherein the first conductivity type is p-type and the second conductivity type is one selected from the group of n-type and i-type.

5. The device as set forth in claim 1, wherein said ratio of germanium/carbon in the second single crystalline semiconductor layer is provided such that said first crystalline semiconductor layer and said second single crystalline semiconductor layer have substantially matching lattice constants.

6. The device as set forth in claim 5, wherein lattice mismatch of the lattice constants of the first crystalline and the second crystalline semiconductor layers is not larger than 1 percent.

7. The device as set forth in claim 1, wherein carbon content in the second single crystalline semiconductor layer is in the range of 1 to 12 atomic percent.

8. A semiconductor device comprising:
   a semiconductor substrate;
   a plurality of semiconductor layers stacked on the semiconductor substrate, having a first semiconductor layer which is made mainly of crystalline silicon and a second semiconductor layer formed on the first semiconductor layer, being made of single crystalline silicon-germanium-carbon having an atomic number ratio of germanium/carbon in the range of 6.7/1 to 12/1;
   a pair of first electrodes for making current flow in the plurality of semiconductor layers; and
   a second electrode for injecting signal current into the plurality of semiconductor layers so as to control the current flow.

9. The device as set forth in claim 8, wherein the first semiconductor layer has a first conductivity type and the second semiconductor layer has a second conductivity type so as to form a pn-junction therebetween.

10. The device as set forth in claim 8, wherein the first semiconductor layer is doped with p-type impurities and the second semiconductor layer is doped with n-type impurities.

11. The device as set forth in claim 10, wherein one of the first electrodes is connected to the second semiconductor layer and the second electrodes are connected to the first semiconductor layer.

12. The device as set forth in claim 8, wherein the first semiconductor layer makes up a base region and the second semiconductor layer makes up an emitter region.

13. The device as set forth in claim 8, wherein the first semiconductor layer makes up a collector region and the second semiconductor layer makes up a base region.

14. A semiconductor device comprising:
   a semiconductor substrate;
   a plurality of semiconductor layers stacked on the semiconductor substrate, having a first crystalline semiconductor layer made mainly of silicon and a second single crystalline semicondcutor layer made of a silicon-germanium-carbon alloy formed on said first crystalline semiconductor layer wherein an atomic number ratio of germanium/carbon in the second single crystalline semiconductor layer is in the range of 6.71 to 12/1;
   a pair of first electrodes for making a current flow in the plurality of semiconductor layers; and
   a second electrode for controlling current flow between said pair of first electrodes.

15. A semiconductor device comprising:
   a first semiconductor layer being made of crystalline silicon; a second semiconductor layer being made of - single crystalline silicon-germanium-carbon alloy having an atomic number ratio of germanium/carbon in the range of 6.7/1 to 12/1, formed the first semiconductor layer, wherein incident light is converted into carriers; and
   a pair of electrodes for extracting current caused by the carriers.

16. The device as set forth in claim 15, wherein the second semiconductor layer is undoped.

17. The device as set forth in claim 16, wherein the second semiconductor layer is sandwiched by a p-type layer, and an n-type layer.

18. The device as set forth in claim 15, wherein the first semiconductor layer is doped with n-type impurities.

19. The device as set forth in claim 8, wherein said atomic number ratio of germanium/carbon of said second semiconductor layer is provided such that said first semiconductor layer and said second semiconductor layer have substantially matching lattice constants.

20. The device as set forth in claim 14, wherein said atomic number ratio of germanium/carbon in said second single crystalline semiconductor layer is provided such that said first crystalline semiconductor layer and said second single crystalline semiconductor layer have substantially matching lattice constants.

21. The device as set forth in claim 15, wherein said atomic number ratio of germanium/carbon of said second semiconductor layer is provided such that said first semiconductor layer and said second semicondcutor layer have substantially matching lattice constants.

22. The device as set forth in claim 19, wherein lattice mismatch of the lattice constants of said first semiconductor layer and said second semiconductor layer is not larger than 1 percent.

23. The device as set forth in claim 20, wherein lattice mismatch of the lattice constants of the first crystalline and the second single crystalline semiconductor layers is not larger than 1 percent.

24. The device as set forth in claim 21, wherein lattice mismatch of the lattice constants of said first semiconductor layer and said second semiconductor layer is not larger than 1 percent.

25. The device as set forth in claim 5, wherein lattice mismatch of the lattice constants of the first crystalline and the second single crystalline semiconductor layers is not larger than 0.5 percent.

26. The device as set forth in claim 19, wherein lattice mismatch of the lattice constants of said first semiconductor layer and said second semiconductor layer is not larger than 0.5 percent.

27. The device as set forth in claim 20, wherein lattice mismatch of the lattice constants of the first crystalline and the second single crystalline semiconductor layers is not larger than 0.5 percent.

28. The device as set forth in claim 21, wherein lattice mismatch of the lattice constants of said first semiconductor layer and said second semiconductor layer is not larger than 0.5 percent.

* * * * *